(12) United States Patent
Joyner

(10) Patent No.: US 6,228,747 B1
(45) Date of Patent: May 8, 2001

(54) ORGANIC SIDEWALL SPACERS USED WITH RESIST

(75) Inventor: Keith A. Joyner, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/271,725

(22) Filed: Mar. 18, 1999

Related U.S. Application Data

(60) Provisional application No. 60/079,237, filed on Mar. 25, 1998.

(51) Int. Cl.$^7$ .................................................. H01L 21/76
(52) U.S. Cl. ......................... 438/436; 438/424; 438/438; 257/394
(58) Field of Search ..................................... 438/436, 424, 438/438, 435, 148, 437, 428, 245, 242, 638, 388, 489; 257/394, 374, 510, 332, 329, 397

(56) References Cited

U.S. PATENT DOCUMENTS

| | | | |
|---|---|---|---|
| 4,889,827 | * 12/1989 | Willer | 437/41 |
| 5,365,097 | * 11/1994 | Kenney | 257/302 |
| 5,422,294 | * 6/1995 | Noble, Jr. | 437/52 |
| 5,512,767 | * 4/1996 | Noble, Jr. | 257/301 |
| 5,641,694 | * 6/1997 | Kenney | 438/156 |
| 5,744,386 | * 4/1998 | Kenney | 438/245 |
| 5,798,553 | * 8/1998 | Furukawa et al. | 257/394 |
| 5,945,724 | * 8/1999 | Parekh et al. | 257/510 |
| 6,008,108 | * 12/1999 | Huang et al. | 438/436 |

\* cited by examiner

Primary Examiner—Charles Bowers
Assistant Examiner—Laura M. Schillinger
(74) Attorney, Agent, or Firm—Dwight N. Holmbo; Wade James Brady, III; Frederick J. Telecky, Jr.

(57) ABSTRACT

Disposable spacers of an organic material or a low-temperature inorganic material provide advantages in the formation of STI trenches and contact holes and additional freedom in line spacing.

6 Claims, 7 Drawing Sheets

US 6,228,747 B1

ORGANIC SIDEWALL SPACERS USED WITH RESIST

This application claims priority under 35 USC § 119 (e)(1) of provisional application number 60/079,237, filed Mar. 25, 1998.

BACKGROUND AND SUMMARY OF THE INVENTION

The present invention relates to integrated circuit structures and fabrication methods.

BACKGROUND: SCALING

A continuing trend in integrated circuit device technology, for a great many years, has been the steady shrinkage of device dimensions. This shrinkage has preceded on a fairly steady exponential curve for many years. The minimum patterned dimension is commonly referred to as the "critical dimension." With conventional MOS technology, as the critical dimension shrinks, the gate oxide becomes thinner, the diffusions become shallower, and the transistor minimum channel length becomes smaller. Commonly the supply voltage is also reduced. Further details regarding conventional scaling strategies can be found, for example, in Voorde, "MOSFET scaling into the future," Hewlett-Packard Journal, vol. 48, no. 4, pp. 96–100 (Aug. 1997), which is hereby incorporated by reference.

BACKGROUND: SHALLOW TRENCH ISOLATION

A very popular isolation method in current semiconductor processing is shallow trench isolation. One persistent problem which has been encountered is the edge effect at the top corners of the trenches. If the oxide at the edges of the trenches is too thin, or if the boundary between the oxide and silicon forms too sharp a corner, the electrical field may create inversion so that a parasitic transistor exists. This is especially a problem in circuits which operate with dual voltages and in embedded flash processes, since transistors can have different thicknesses of gate oxides. In these processes, an extra HF etch can thin the oxide at the STI corner. Many solutions to this problem are currently under study, as exemplified by the following articles, all of which are hereby incorporated by reference: Iwamoto et al., HIGHLY-RELIABLE ULTRA THIN GATE OXIDE FORMATION PROCESS, 1996 IEDM, p. 29.7.1–29.7.4; Kim et al., NITRIDE CLADDED POLY-SI SPACER Locos (NCPSL) ISOLATION TECHNOLOGY FOR THE 1 GIGA BIT DRAM, 1996 IEDM, p. 32.2.1–32.2.4; Chatterjee et al., A SHALLOW TRENCH ISOLATION USING LOCOS EDGE FOR PREVENTING CORNER EFFECTS FOR 0.25/0.18 MICRON CMOS TECHNOLOGIES AND BEYOND, 1996 IEDM, p. 32.3.1–32.3.4; Watanabe et al., CORNER-ROUNDED SHALLOW TRENCH ISOLATION TECHNOLOGY TO REDUCE THE STRESS-INDUCED TUNNEL OXIDE LEAKAGE CURRENT FOR HIGHLY RELIABLE FLASH MEMORIES, 1996 IEDM, p. 32.4.1–32.4.4; Chen et al., A NOVEL 0.25 MICRON SHALLOW TRENCH ISOLATION TECHNOLOGY, 1996 IEDM, p. 32.5.1–32.5.4; Chang et al., A HIGHLY MANUFACTURABLE CORNER ROUNDING SOLUTION FOR 0.18 MICRON SHALLOW TRENCH ISOLATION, 1997 IEDM, p. 27.2.1–27.2.4; Shum et al., CORNER FIELD EFFECT OF THE CMP OXIDE RECESS IN SHALLOW TRENCH ISOLATION TECHNOLOGY FOR HIGH DENSITY FLASH MEMORIES, 1997 IEDM, p. 27.3.1–27.3.4.

BACKGROUND: FORMATION OF CONTACTS

As the size of contact and via holes shrink, it has been necessary to use thinner photo-resist. This, in turn, means that a less aggressive oxide etch must be used, so that the photo-resist is not destroyed in the process. Additionally, when using thinner resist, the contact or via etch must have greater selectivity to resist, and this requirement is approaching the limitation of current etches.

BACKGROUND: LINE/SPACE ADJUSTMENT

As the limits of current lithographic techniques are reached, methods of attaining smaller sized structures have been explored. It is known to use sidewall spacers on masking structures as a means to attain sub-lithographic dimensions. I.e., as seen in FIG. 4A, sidewall spacers 412 are added to masking layer 410 to decrease the opening 414 below the limits of the lithography. Masking layer 410 can be a hard mask, such as silicon nitride, or it can be a structural feature, such as a gate line; the spacers are typically an oxide, nitride, or other suitable material. However, this technique has been limited by the fact that the available materials for forming sidewalls require high temperature processing, and their use is thus incompatible with the presence of photo-resist.

Organic Sidewall Spacers

It is herein disclosed to use organic materials, such as parylene and plasma deposited polymers, for disposable spacers. One class of embodiments uses disposable organic spacers in combination with definition of a shallow-trench-isolation pattern, to promote rounding of the trench edge and protection of this edge during subsequent etches. Another class of embodiments uses disposable organic spacers to decrease the size of contact holes and vias. Since the lithographic size of the hole in the photo-resist can be increased for a given end result, this allows a thicker photo-resist to be used, with the consequent ability to use a more aggressive oxide etch, while decreasing etch selectivity limits. Another class of embodiments uses disposable organic sidewall spacers in combination with photo-resist to permit alteration of the line-to-space ratio, and to create sub-lithographic structures.

A particular advantage of the use of organic materials as spacers is that they can be removed by ashing, which is not only a fairly benign process, but also one which must already be performed to remove photo-resist after patterning steps. Thus, the disclosed inventions provide new degrees of freedom for pattern adjustment while imposing minimal additional process complexity.

The disclosed methods and structures have the following advantages, although not every embodiment shares all the advantages:

- can be used in combination with resist;
- spacers can be ashed along with resist;
- use in STI promotes rounding of corner of trench;
- use in STI allows more coverage of corners with fill oxide;
- eliminates leakage at corners of STI trench;
- lithographic requirements can be relaxed for a given feature size, or alternatively, sub-lithographic features can be created;
- less expensive stepper can be used;
- allows use of thicker resist;
- allows use of less selective etch;
- wider process margin for patterning.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 shows a generalized flow chart of key steps in the disclosed process, while

FIG. 4A shows a known technique for using sidewall spacers to create sub-lithographic features, while

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

General Process Flow

Figure 1:
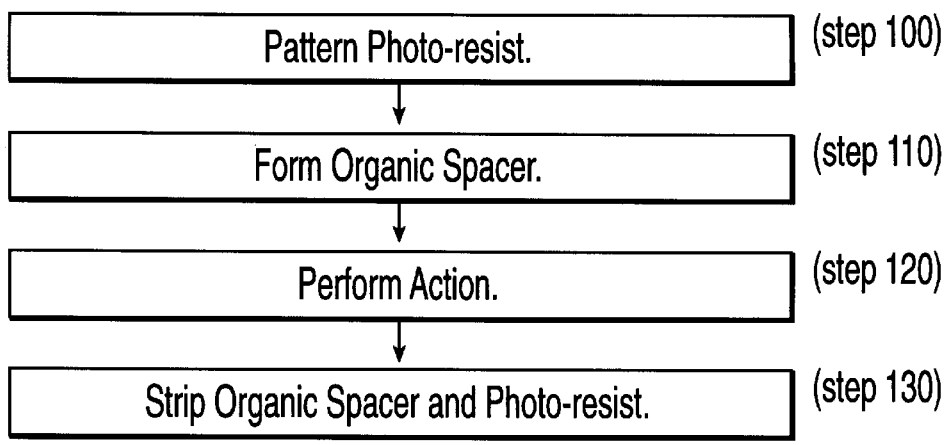

FIG. 1 gives a generic flowchart for use of the disclosed organic spacers. A layer of photo-resist is deposited over an underlying layer which is to receive a patterned etch or implant. Several specific embodiments are given below to illustrate the possibilities, but these are by no means exclusive of other processes which use a patterned layer. The photo-resist is exposed and developed (step 100). Next, a layer of an organic material, such as parylene, is conformally deposited and anisotropically etched to create sidewall spacers (step 110).

With the organic sidewall spacers in place, an action is performed (step 120) for which the photo-resist and spacers are to act as a mask. The ensuing examples disclose etch steps as the action performed, although this can also be an implantation step, or any step which utilizes a lithographic mask. Finally, the organic spacers are removed (step 130), generally in the ashing process which removes the photo-resist. Alternatively, parylene can be removed selective to resist.

First Embodiment: Isolation Structure Fabrication

Figure 1A:
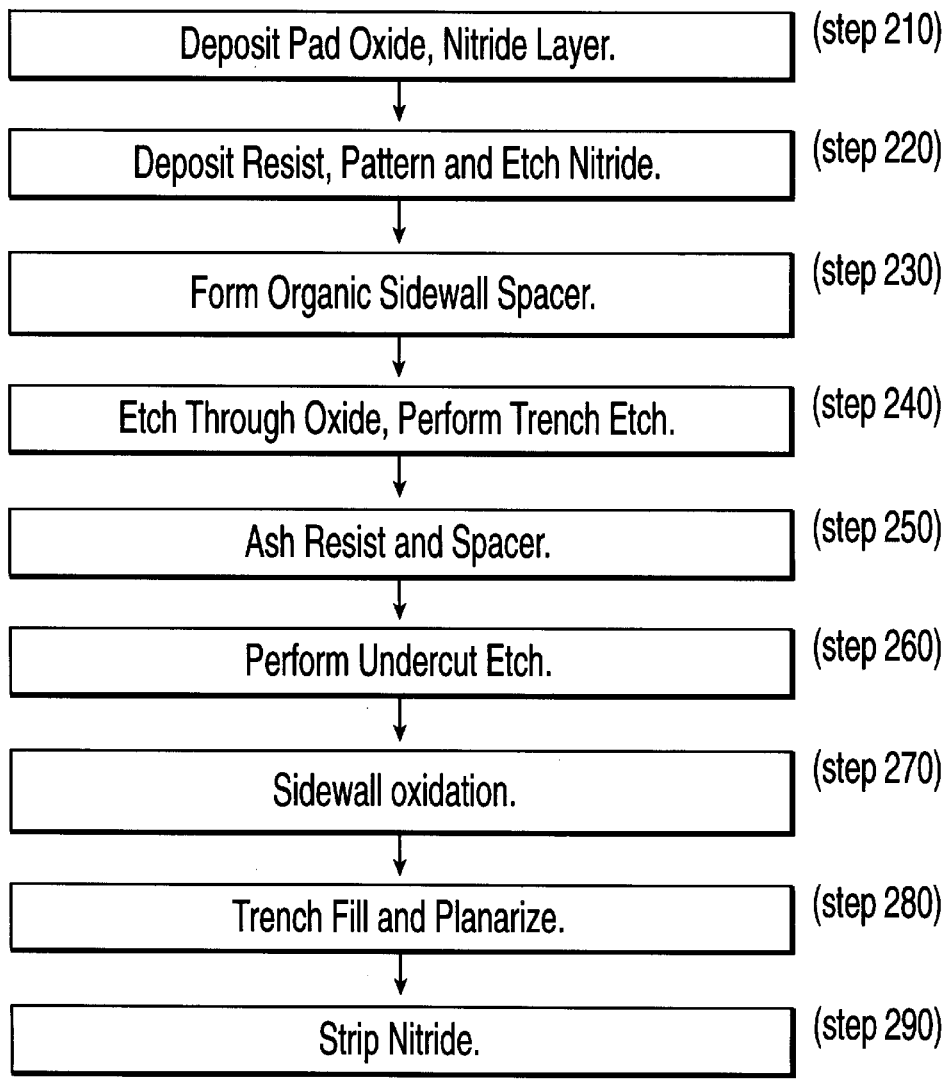
FIGS. 1A–1C show flow charts of the process as it applies to separate embodiments.

FIG. 1A is a flow chart of a trench isolation process in which the patterned oxidation barrier (silicon nitride in this case) is non-lithographically modified by a disposable organic sidewall spacer. This will be discussed in relationship to FIGS. 2A–2F, which show a cross-section of an integrated circuit at various points in the fabrication of shallow trench isolation.

Figure 2A:
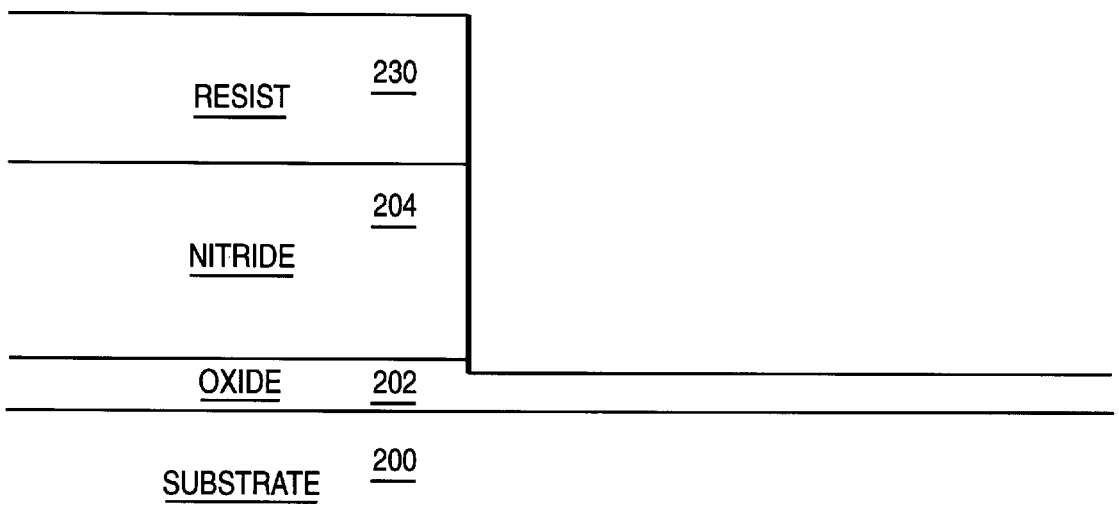
FIGS. 2A–2F show cross-sections of the integrated circuit at various points of the disclosed flow for STI trench formation.
Figure 2B:
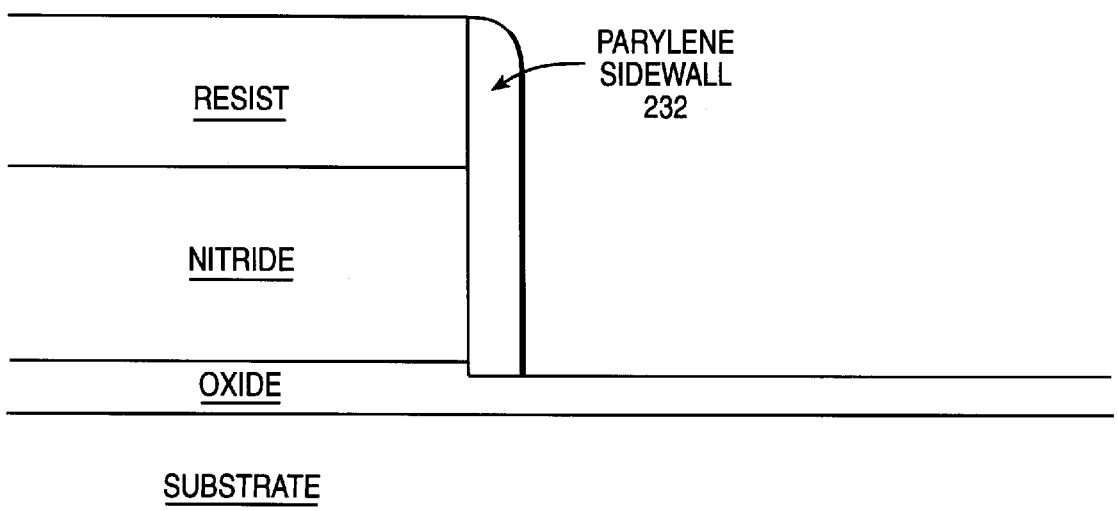

The process begins with growth of a pad oxide 202 on a substrate 200 and deposition (step 210) of a masking layer 204, which in this example is silicon nitride. A photo-resist 230 is deposited over the nitride 204, and patterned to expose areas where trench isolation is desired. The nitride layer is then etched through the resist layer, with the etch stopping within the oxide layer (step 220). This gives the structure shown in FIG. 2A. A layer of parylene, or other organic material is then deposited and anisotropically etched to form sidewall spacers 232 on the edges of the resist and nitride stack (step 230), as seen in FIG. 2B.

Figure 2C:
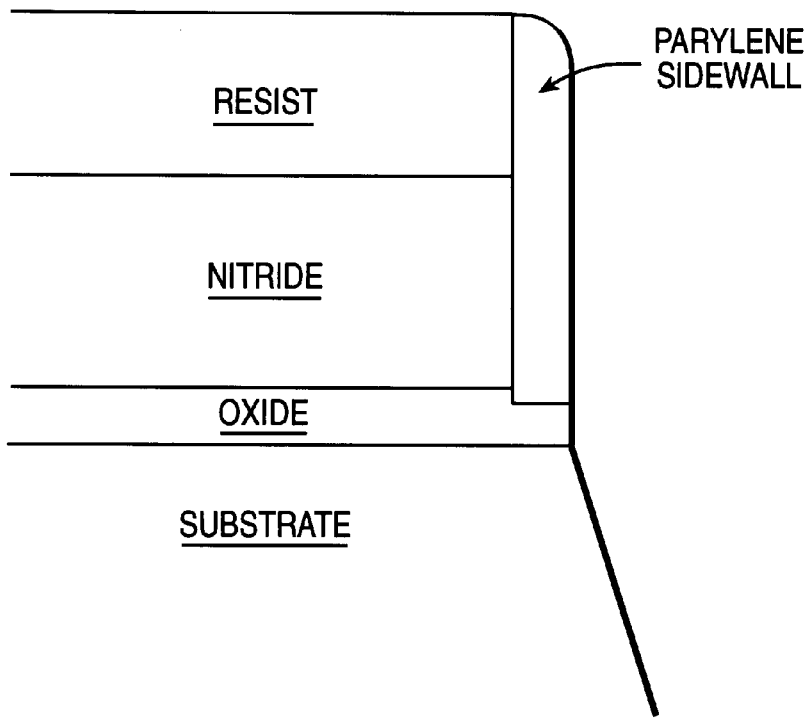
Figure 2D:
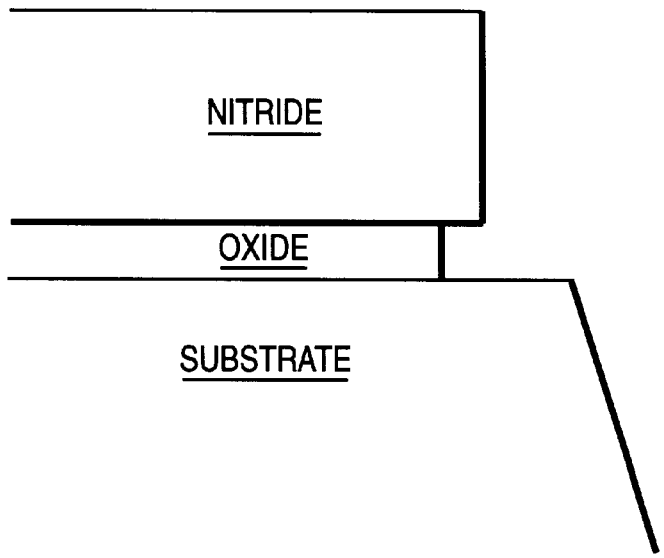
Figure 2E:
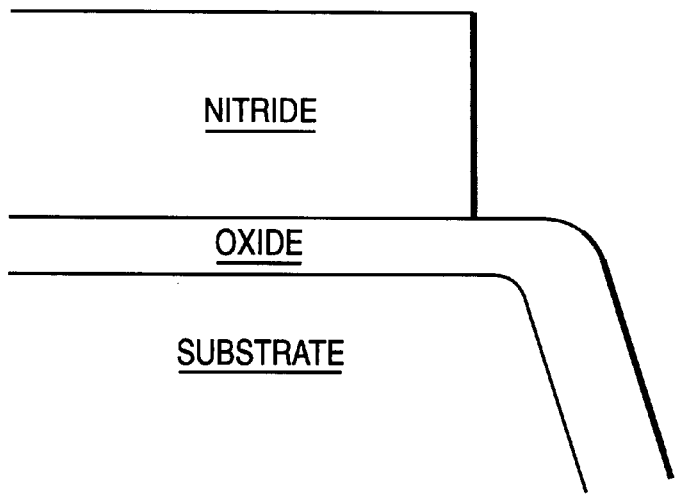
Figure 2F:
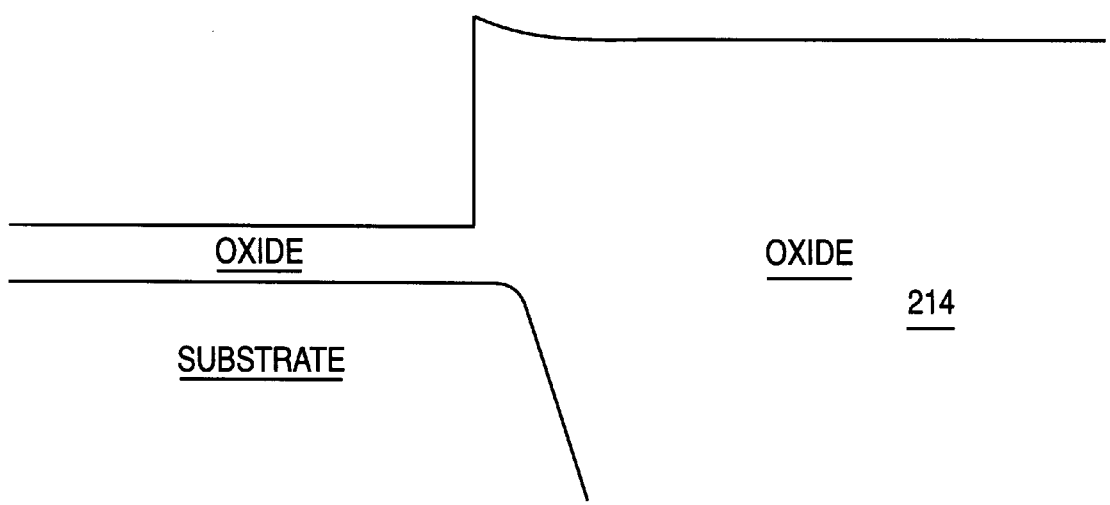

An etch is then performed (step 240) to go through the oxide 202 and to form the desired trench structure 210 in the substrate 200, shown in FIG. 2C. The resist 230 and spacers 232 can then be removed by ashing (step 250); a short isotropic oxide etch (step 260) creates a slight undercut of the oxide layer away from the edge of the trench, seen in FIG. 2D. An oxidation (step 270) is performed to grow a thin layer of thermal oxide 212 on the sidewalls of the trench. As shown in FIG. 2E, this step will also grow oxide on the substrate area exposed by the removed spacers and by the oxide etch. Because the nitride 204 is set back from the edge of the trench 210, a thicker, more rounded thermal oxide 212 is grown at the trench edge, providing greater protection against leakage along this edge. Finally, a layer of oxide 214 is deposited and planarized (step 280), to fill the trench, followed by stripping the nitride mask (step 290) to give the structure of FIG. 2F.

Low-Temperature Inorganics in STI

It is also possible to use low-temperature inorganic materials as disposable spacers in the creation of shallow trench isolation. These materials can include low temperature oxides or oxynitrides, or sputtered materials such as amorphous silicon. However, since the sputtered or low-temperature inorganic materials typically have a lower conformality than the organics, they are usually less desirable. Additionally, these inorganics may not be removed by the ashing procedure, but may require separate etches.

Second Embodiment: Contact/Via Etch

Figure 1B:
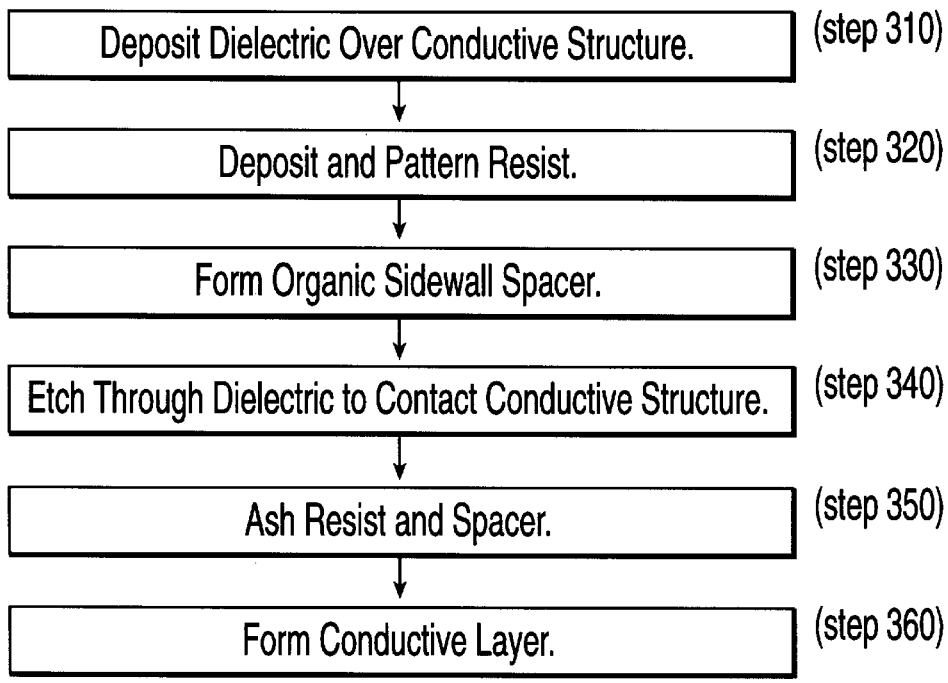
Figure 3A:
FIGS. 3A–3D show cross-sections of the integrated circuit at various points of the disclosed flow for contact/via formation.
Figure 3B:
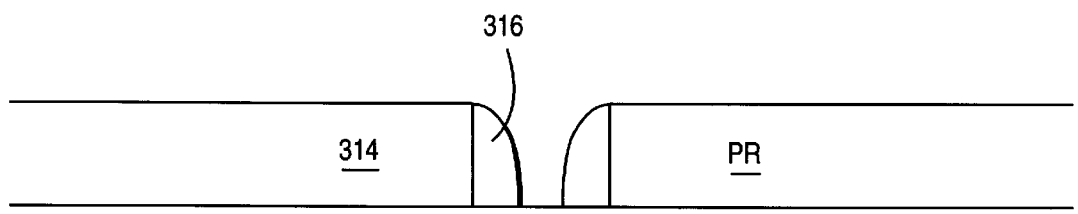

A second embodiment of the disclosed invention is used to create contact or via holes. The flow is shown in FIG. 1B, while cross-sections of the integrated circuit during fabrication is shown in FIGS. 3A–3D. This method can be used in several ways. Organic spacers can be used to create sub-lithographic openings, or they may be used to scale down a hole which was created at a larger size in the photoresist to allow use of a thicker resist. In FIG. 3A, a conductive structure 310 is shown. This may be part of a transistor, such as a gate or source/drain contact, or may be a metallization layer in the integrated circuit. Dielectric layer 312, generally of oxide, is deposited (step 310) over conductive structure 310. Resist layer 314 is deposited, patterned and developed (step 320) to expose the dielectric 312 at the point of a desired contact or via. As seen in FIG. 3B, a layer of a organic material, parylene in this example, is deposited and anisotropically etched (step 330) to form sidewall spacers 316 on the interior of the resist pattern, effectively reducing the diameter of the hole to be etched.

Figure 3C:
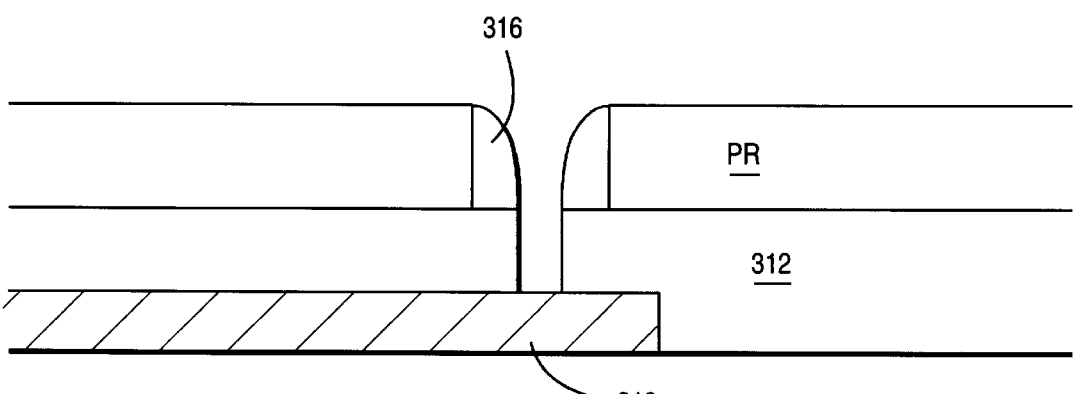
Figure 3D:
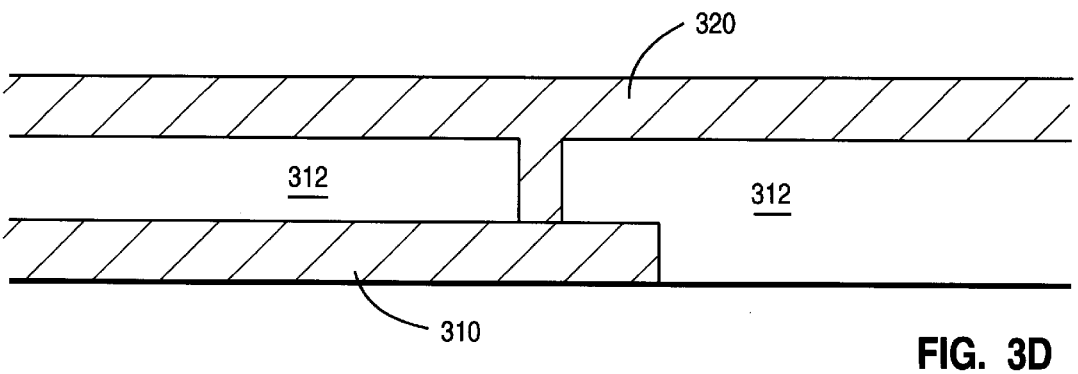

An etch is then performed (step 340), masked by the resist and spacers, to open a hole through the dielectric layer 312 and expose the underlying conductive structure 310, as seen in FIG. 3C. The resist 314 and sidewall spacers 316 are ashed (step 350) and a layer of metal 320 is deposited (step 360) to fill the contact/via, giving the structure seen in FIG. 3D.

Figure 1C:
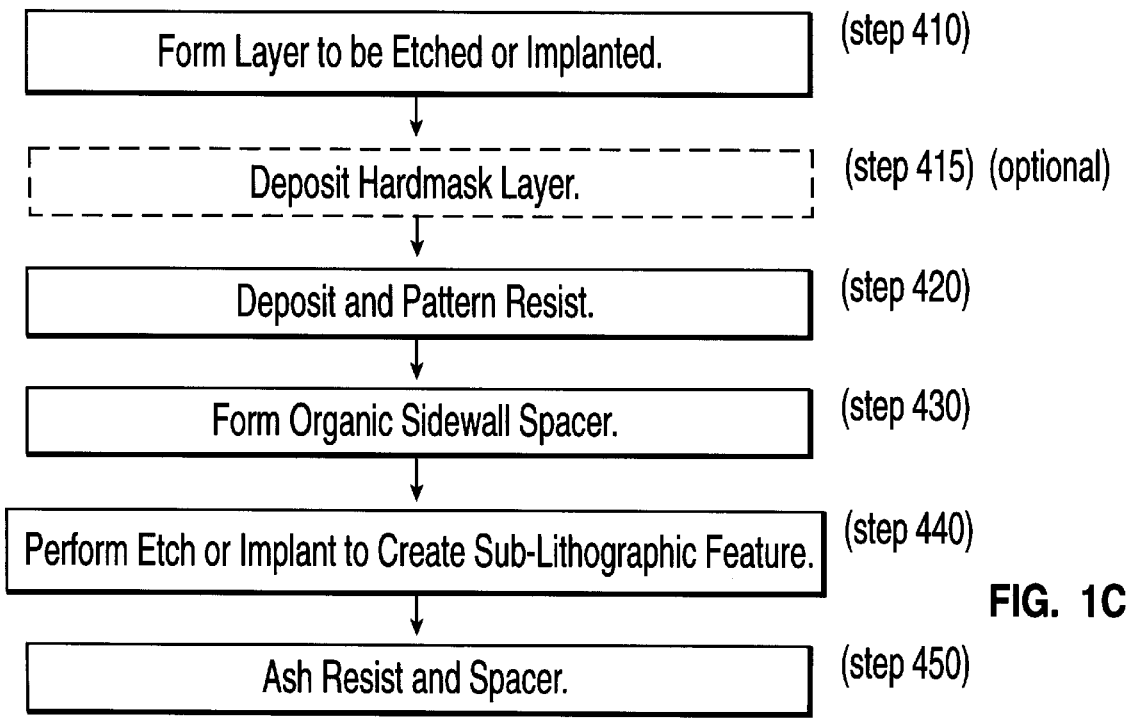
Figure 4A:
Figure 4B:
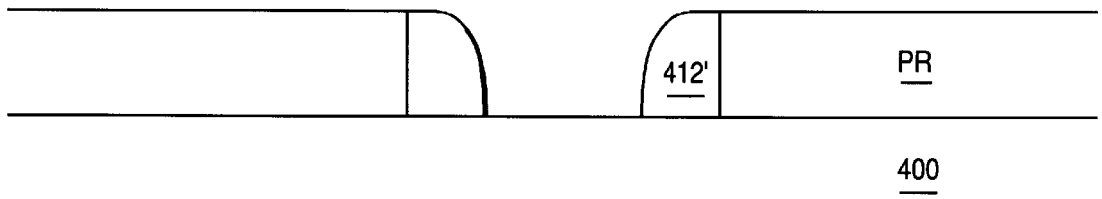
FIGS. 4B and 4C show the disclosed organic disposable spacers used in conjunction with photo-resist, which the known techniques were not able to do.

Third Process Embodiment:

FIG. 4B shows the disclosed organic sidewall spacers used with resist to create sub-lithographic features, while FIG. 1C shows the flow of this embodiment. After formation (step 410) of the underlying layer 400 in which a sub-lithographic feature is to be formed, resist,layer PR is deposited and patterned (step 420) to the limit of the lithographic technique in use. After the photo-resist is patterned, but prior to etch or implantation of underlying layer 400, organic spacers 412' are formed (step 430). The addition of the sidewall spacers allows the feature which is formed through the mask (step 440) to be smaller than the lithographic limits. Finally, the mask, of photo-resist and organic spacer, is removed by ashing (step 450), a much simpler process than removal of a hard mask.

Figure 4C:
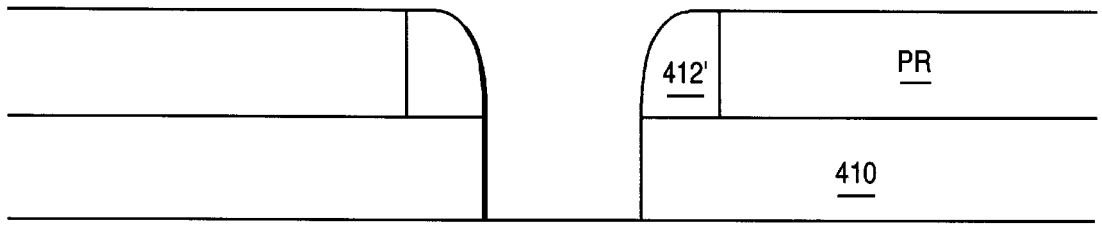

Alternatively, as seen in FIG. 4C, photo-resist PR and organic spacers 412' can be used in conjunction with a hard mask 410, which is deposited in optional step 415 to provide additional freedom in design.

This embodiment of disposable organic spacers can be used during metallization, DRAM capacitor fabrication (to use more of the available area for capacitor fabrication), in non-volatile memory floating gate fabrication, and in general anywhere a relatively low temperature sidewall material (room temperature to 600 degrees C.) could be used.

Alternate Embodiment: Plasma Fluorocarbon Polymer

As an alternative to parylene, the organic spacers can also be formed of plasma fluorocarbon polymer. This is essentially a teflon material with good adhesion to surfaces which can also be used as a low-k dielectric.

According to a disclosed class of innovative embodiments, there is provided: A method to form an integrated circuit, comprising the step of: forming a disposable organic feature, to laterally extend a patterned layer, in the presence of photo-resist.

According to another disclosed class of innovative embodiments, there is provided: An integrated circuit processing method, comprising the steps of: using a patterned photo-resist to form a structure having at least one edge; prior to removal of said photo-resist, forming organic sidewall spacers which are self-aligned to said edge; performing a processing operation which is at least partially localized by said organic sidewall spacers; and removing said organic sidewall spacers.

According to another disclosed class of innovative embodiments, there is provided: A method for forming transistor isolation structures, comprising the steps of: (a.) forming a patterned masking layer which overlies a substrate containing a body of semiconductor material; (b.) forming disposable spacers on sidewalls of said masking layer; (c.) etching said substrate, in areas exposed by said masking layer and said sidewalls, to form said isolation structures; (d.) removing said disposable spacers; (e.) oxidizing exposed portions of said semiconductor material; and (f.) filling said isolation structures with a dielectric material.

According to another disclosed class of innovative embodiments, there is provided: A method for forming contacts or vias in an integrated circuit structure, comprising the steps of: (a.) forming transistor structures in a substrate which contains a body of semiconductor material; (b.) forming a dielectric over said substrate and said transistor structures; (c.) depositing and patterning a resist material to form holes therethrough which expose portions of said dielectric in which contacts or vias are desired; (d.) forming spacers of an organic material on the interior of said holes, whereby the diameter of said holes is reduced; and (e.) etching said dielectric, in the areas exposed by said holes, to expose an underlying conductive structure.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. An integrated circuit processing method, comprising the steps of:

using a patterned photo-resist to form a structure having at least one edge;

prior to removal of said photo-resist, forming organic sidewall spacers which are self-aligned to said edge;

performing a processing operation which is at least partially localized by said organic sidewall spacers; and simultaneously removing said organic sidewall spacers and said photo-resist.

2. The method of claim 1, wherein said processing operation comprises forming isolation trenches.

3. A method for forming transistor isolation structures, comprising the steps of:

(a.) forming a patterned masking layer which overlies a substrate containing a body of semiconductor material;

(b.) forming disposable spacers on sidewalls of said masking layer;

(c.) etching said substrate, in areas exposed by said masking layer and said sidewalls, to form said isolation structures;

(d.) simultaneously removing said disposable spacers and said patterned masking layer;

(e.) oxidizing exposed portions of said semiconductor material; and (f.) filling said isolation structures with a dielectric material.

4. The method of claim 3, wherein said disposable spacers substantially consist of parylene.

5. A method for forming contacts or vias in an integrated circuit structure, comprising the steps of:

(a.) forming transistor structures in a substrate which contains a body of semiconductor material;

(b.) forming a dielectric over said substrate and said transistor structures;

(c.) depositing and patterning a resist material to form holes there through which expose portions of said dielectric in which contacts or vias are desired;

(d.) forming spacers of an organic material on the interior of said holes, whereby the diameter of said holes is reduced;

(e.) etching said dielectric, in the areas exposed by said holes, to expose an underlying conductive structure; and (f.) simultaneously removing said organic material and said resist material.

6. The method of claim 5, wherein said spacers substantially comprise parylene.

* * * * *